(12) United States Patent
Kramp et al.

(10) Patent No.: US 10,636,754 B2
(45) Date of Patent: Apr. 28, 2020

(54) SEMICONDUCTOR CHIP AND METHOD FOR FORMING A CHIP PAD

(71) Applicant: Infineon Technologies AG, Neubiberg (DE)

(72) Inventors: Stefan Kramp, Villach (AT); Marco Koitz, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/262,530

(22) Filed: Jan. 30, 2019

(65) Prior Publication Data

US 2019/0189574 A1 Jun. 20, 2019

Related U.S. Application Data

(62) Division of application No. 14/444,874, filed on Jul. 28, 2014, now Pat. No. 10,236,265.

(51) Int. Cl.
*H01L 23/00* (2006.01)

(52) U.S. Cl.
CPC .............. *H01L 24/03* (2013.01); *H01L 24/06* (2013.01); *H01L 24/05* (2013.01); *H01L 24/13* (2013.01); *H01L 24/45* (2013.01); *H01L 24/48* (2013.01); *H01L 2224/0345* (2013.01); *H01L 2224/0381* (2013.01); *H01L 2224/03614* (2013.01); *H01L 2224/03901* (2013.01); *H01L 2224/0401* (2013.01); *H01L 2224/04042* (2013.01); *H01L 2224/05022* (2013.01); *H01L 2224/05124* (2013.01); *H01L 2224/05166* (2013.01); *H01L 2224/05567* (2013.01); *H01L 2224/05572* (2013.01); *H01L 2224/05582* (2013.01); *H01L 2224/05624* (2013.01); *H01L 2224/05647* (2013.01); *H01L 2224/0603* (2013.01); *H01L 2224/06102* (2013.01); *H01L 2224/06505* (2013.01); *H01L 2224/13111* (2013.01); *H01L 2224/45124* (2013.01); *H01L 2224/45144* (2013.01); *H01L 2224/45147* (2013.01); *H01L 2224/73207* (2013.01);
(Continued)

(58) Field of Classification Search
None
See application file for complete search history.

(56) References Cited

U.S. PATENT DOCUMENTS

| 7,230,326 B2 | 6/2007 | Ohkura |
|---|---|---|
| 8,987,861 B2 | 3/2015 | Funaya et al. |
| 9,245,868 B2 | 1/2016 | Torwesten et al. |

(Continued)

FOREIGN PATENT DOCUMENTS

| CN | 1536658 A | 10/2004 |
|---|---|---|
| CN | 1744309 A | 3/2006 |

*Primary Examiner* — Telly D Green
(74) *Attorney, Agent, or Firm* — Slater Matsil, LLP

(57) ABSTRACT

A semiconductor chip with different chip pads and a method for forming a semiconductor chip with different chip pads are disclosed. In some embodiments, a semiconductor chip includes a chip front side, a first chip pad located on the chip front side, a second chip pad located on the chip front side and an electrically insulating material located between the first chip pad and the second chip pad, wherein the first chip pad includes a surface layer predominantly comprising copper and the second chip pad includes a surface layer predominantly comprising aluminum.

8 Claims, 6 Drawing Sheets

(52) U.S. Cl.
CPC .............. *H01L 2924/00014* (2013.01); *H01L 2924/13055* (2013.01); *H01L 2924/13091* (2013.01)

(56) References Cited

U.S. PATENT DOCUMENTS

| | | |
|---|---|---|
| 2005/0035449 A1 | 2/2005 | Kawanabe et al. |
| 2006/0231951 A1 | 10/2006 | Jan et al. |
| 2007/0275503 A1* | 11/2007 | Lin .................... H01L 24/29 |
| | | 438/106 |
| 2008/0006945 A1 | 1/2008 | Lin et al. |
| 2008/0230905 A1 | 9/2008 | Guth et al. |
| 2012/0170887 A1 | 7/2012 | Yang et al. |
| 2014/0001634 A1 | 1/2014 | Torwesten et al. |
| 2014/0175602 A1 | 6/2014 | Funaya et al. |

* cited by examiner

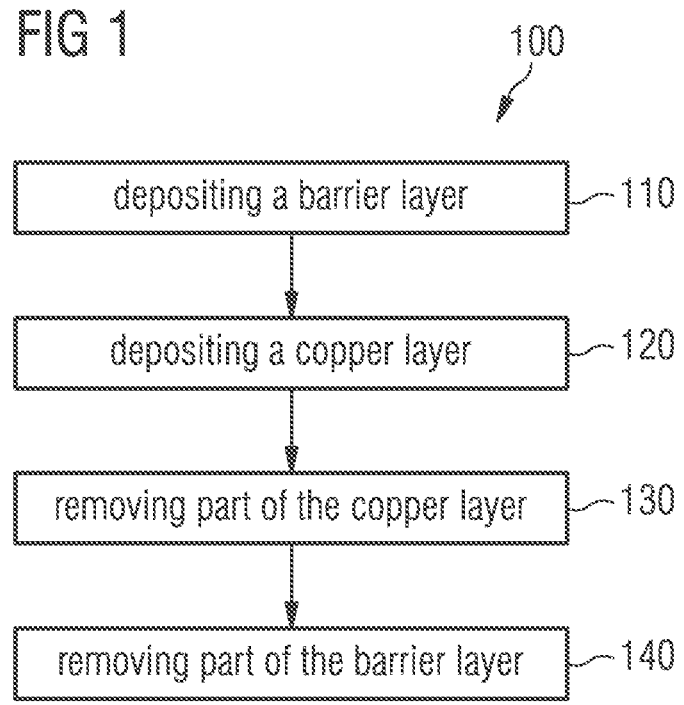

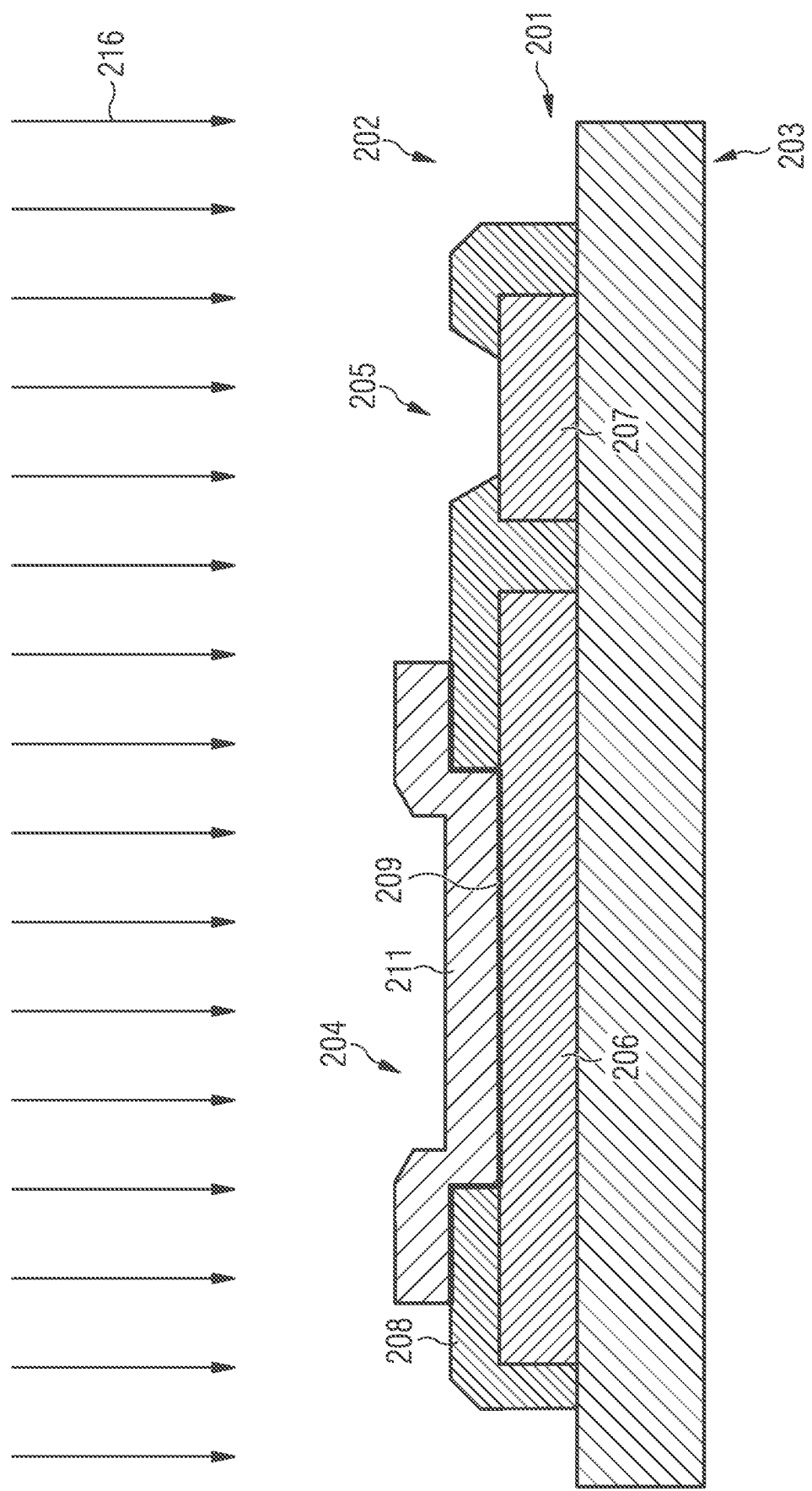

SEMICONDUCTOR CHIP AND METHOD FOR FORMING A CHIP PAD

CROSS-REFERENCE TO RELATED APPLICATIONS

This application is a divisional of U.S. application Ser. No. 14/444,874, filed on Jul. 28, 2014, which application is hereby incorporated herein by reference.

TECHNICAL FIELD

Embodiments relate to chip pads and in particular to a semiconductor chip and a method for forming a chip pad.

BACKGROUND

While solderable chip back sides exist in the market, the manufacturing of solderable chip front sides is much more challenging. The technical challenges of a solderable front side are to find a materials system in combination with a manufacturing process which may cope with a variety of aspects. These include good electrical contact properties, good mechanical contact properties, good solderability, compatibility with the electronic device requirements, e.g. being free of surface leakage current, compatibility with various chip surfaces, e.g. compatible with passivation and metallization materials, being corrosion-free, displaying good adhesion to mold material and being bondable to wire bonds such as copper (Cu), aluminum (Al) and gold (Au) wire bonds. In addition, the manufacturing process should be inexpensive, capable of large processing windows, (e.g. capable of high production volume), and appropriate for lead and lead-free solders.

SUMMARY

Some embodiments relate to a method for forming a chip pad. The method includes depositing a barrier layer over a chip front side and depositing a copper layer after depositing the barrier layer. The method further includes removing part of the copper layer located outside at least a first chip pad region, wherein a remaining portion of the copper layer within the first chip pad region forms a surface layer of the chip pad, and removing part of the barrier layer located outside at least the first chip pad region.

Some embodiments relate to a semiconductor chip. The semiconductor chip includes a first chip pad and a second chip pad. The first chip pad includes a surface layer predominantly including copper and the second chip pad includes a surface layer predominantly including aluminum.

BRIEF DESCRIPTION OF THE DRAWINGS

Some embodiments of apparatuses and/or methods will be described in the following by way of example only, and with reference to the accompanying figures, in which:

FIG. 1 shows a flowchart of a method for forming a chip pad according to various embodiments;

FIGS. 2A to 2D show a schematic illustration of a method for forming a chip pad according to various embodiments.

DETAILED DESCRIPTION OF ILLUSTRATIVE EMBODIMENTS

Figure 2A:
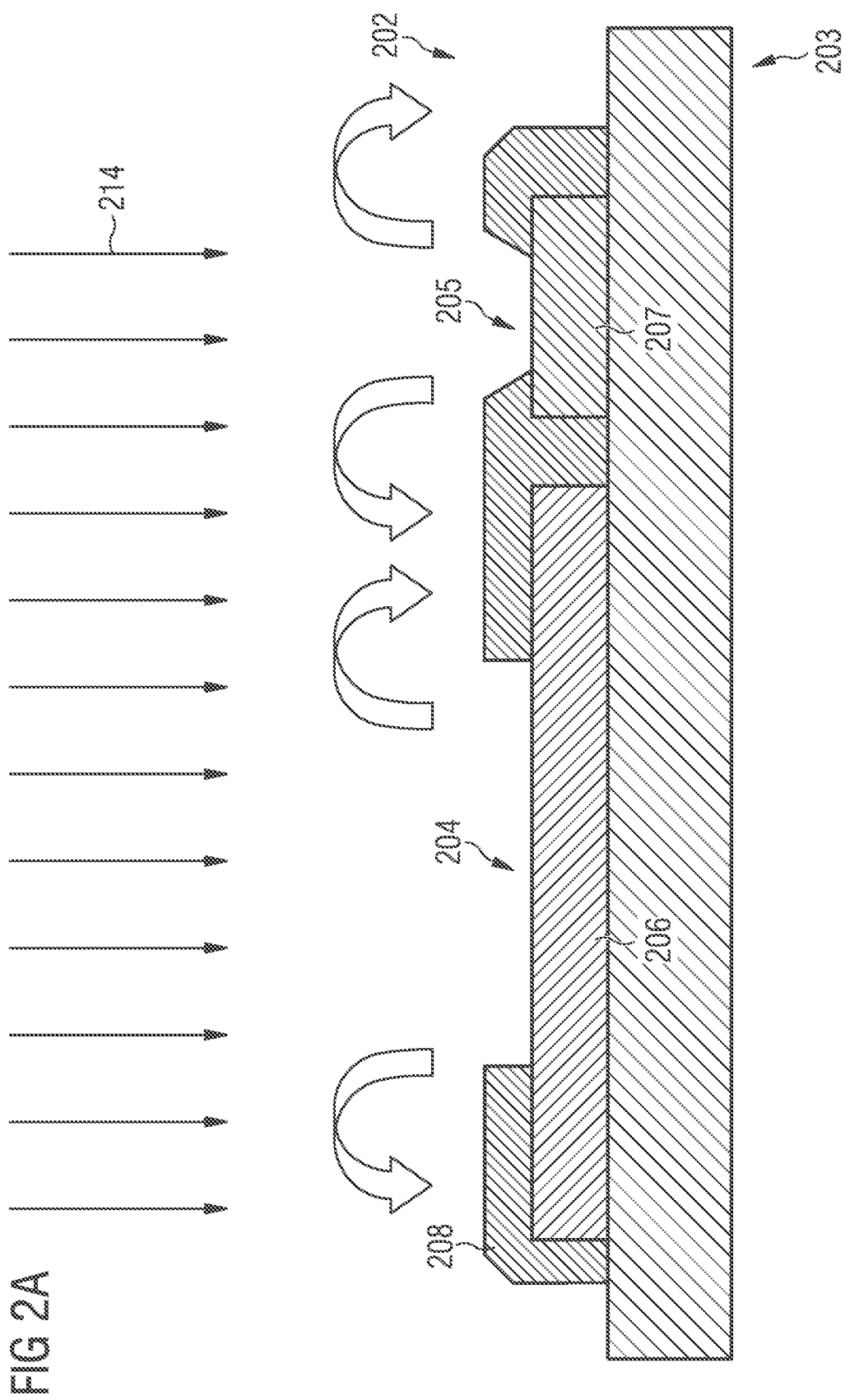

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

FIG. 1 shows a flowchart of a method 100 for forming a chip pad according to an embodiment.

The method 100 includes depositing no a barrier layer over a chip front side and depositing 120 a copper layer after depositing the barrier layer.

The method 100 further includes removing 130 part of the copper layer located outside at least a first chip pad region. A remaining portion of the copper layer within the first chip pad region forms a surface layer of the chip pad.

The method 100 further includes removing 140 part of the barrier layer located outside at least the first chip pad region.

Due to the deposition of the barrier layer and the copper layer over the chip front side and the removal of part of the copper layer and part of the barrier layer located outside at least a first chip pad region, a chip pad with a copper surface layer and a chip pad without a copper surface layer may be formed, for example.

Method 100 may be implemented to form a chip pad of a chip. A chip may comprise a substrate (e.g. a semiconductor substrate or a glass substrate) and one or more electrically insulating layers and/or electrically conductive layers, which may be stacked on a front side of the chip, for example. A semiconductor chip may include a semiconductor substrate material, and may include one or more integrated circuit devices in the chip. For example, the chip may be a power semiconductor chip or a CMOS semiconductor chip. An integrated circuit device may include for example, one or more transistors; e.g. a power transistor, e.g. MOSFET or IGBT, and/or one or more diodes.

The semiconductor chip may be a semiconductor die which may include part of a semiconductor substrate or wafer. The semiconductor substrate may be a silicon-based semiconductor substrate, or silicon carbide-based semiconductor substrate, or gallium arsenide-based semiconductor substrate or gallium nitride-based semiconductor substrate, for example.

The chip may include a chip front side and a chip back side. In comparison to a basically vertical edge (e.g. resulting from separating the substrate of the chip from others) of the substrate of the chip, the main surface or chip front side of the chip may be a basically horizontal surface extending laterally.

A main surface or front side surface of the chip may be a surface of the substrate towards metal layers, insulation layers and/or passivation layers on top of the surface of the substrate or a surface of one of these layers. For example, a chip front side may be the side at which active elements of the chip are formed. For example, in a power semiconductor chip, a chip front side may be a side of the chip at which a first source/drain region and a gate region are formed, and a chip back side may be a side of the chip at which a second source/drain region is formed. For example, more complex structures may be located at the chip front side than at the chip back side.

A chip pad region may include be electrically conductive contact region at and/or on the chip front side or surface. The chip pad region may be electrically connected to at least one electrically active element of an integrated circuit device of the chip. For example, a chip pad region may be electrically connected to an active source/drain region, and further chip pad region may be electrically connected to an active gate region. In other examples, a chip pad region and a further chip pad region may be electrically connected (e.g. short circuited) to the same active element. The chip pad region may be connected to the electrically active elements directly, or optionally via one or more interconnects or intermediate layers. The chip pad region may be further used to provide an electrically connection between the at least one electrically active element of the integrated circuit device of the chip and an external structures and/or external circuit.

The barrier layer may be a layer which functions as an etch-stop layer and/or a diffusion barrier layer. For example, the barrier layer deposited in method 100 may be a metal layer which may be deposited over the whole chip front side.

The barrier layer 209 may be a titanium tungsten (TiW) layer. For example, the tungsten content may range from 60% to 90%, e.g. 70% to 85%. For example, the barrier layer 209 may have a composition of $Ti_{0.2}W_{0.8}$. The titanium tungsten layer may have an average thickness between 20 nm to about 200 nm, e.g., about 50 nm to about 150 nm.

The copper (Cu) layer deposited in method 100 may also be deposited over the whole chip front side. For example, the copper layer may be deposited over or directly on the barrier layer.

The copper layer 211 may be predominantly copper. For example, the copper layer may have a copper content greater than 50%, e.g., greater than 90%, e.g., greater than 99%. The copper layer may have an average thickness between 0.5 µm to 50 µm, e.g., about 1 µm to 50 µm. The copper layer thickness may be chosen depending on wafer/chip bow restrictions, the solder system used and the spreading resistance.

Removing part of the copper layer located outside at least a first chip pad region may uncover part of the barrier layer located outside at least the first chip pad region. The barrier layer may then also be removed subsequently at a location outside at least the first chip pad region.

Due to the deposition of the barrier layer and the copper layer over the chip front side and the removal of part of the copper layer and part of the barrier layer located outside at least a first chip pad region, different chip pads having different materials at the surface may be formed, which creates a versatile device with both solderable and bondable chip pads, for example.

The removal of part of the copper layer located outside at least the first chip pad region, may be implemented by etching the copper layer with a first etching agent. The removal of part of the barrier layer located outside at least the first chip pad region may be implemented by etching the barrier layer with a second etching agent, which may be different from the first etching agent.

Etching part of the copper layer located outside at least the first chip pad region uncovers the barrier layer outside at least the first chip pad region. The barrier layer may function as an etch stop layer against the first etching agent, and may, for example, protect any underlying features or layers on the chip front side from the first etching agent. For example, the barrier layer may protect a second chip pad region or other electrically conductive structures (e.g. test or monitoring structures) from the first etching agent used for etching the copper layer.

FIGS. 2A to 2D show schematic illustrations of a method for forming a chip pad according to an embodiment.

As shown in FIG. 2A, the chip pad regions 204, 205 of the semiconductor chip 201 may include electrically conductive material 206, 207 formed in predetermined positions over the chip front side 202. For example, the first chip pad region 204 may include electrically conductive material 206, which may be in electrical contact with a first active element of a device on the chip. This may be a first source/drain region of a transistor, for example. For example, the second chip pad region 205 may include electrically conductive material 207, which may be in electrical contact with a second active element of a device on the chip. This may be a gate region of the transistor, for example. The chip back side 203 may also include a back side contact, which may be in electrical contact with a second active element of a device on the chip. This may be a backside metallization layer for a second source/drain region of the transistor, for example.

Electrically insulating material 208 may be deposited or formed over the chip pad regions 204, 205. The electrically insulating material 208 may partially surround parts of the chip pad regions 204, 205. Holes formed in predefined locations in the electrically insulating material expose at least part of each of the chip pad regions 204, 205, (the electrically conductive material 206, 207 at the chip front side surface). For example, the electrically insulating material 208 may be removed at certain predefined locations, for example, from the regions over each chip pad region 204, 205.

The electrically insulating material 208 may include or consist of, for example, polyimide. The electrically conductive material 206, 207 may include or consist of, for example, aluminum. For example, the electrically conductive material 206, 207 may include or have a composition of predominantly aluminum e.g. may have an aluminum content greater than 50%, or greater than 90%, or greater than 99%.

Optionally, alternatively or additionally, a non-oxidizing plasma represented by the arrows 214, may be applied to the chip front side 202 (see FIG. 2A) before depositing the barrier layer over the chip front side 202. The non-oxidizing plasma may be applied to the chip as an in situ metal surface clean. For example, the non-oxidizing plasma may be an Ar+ sputter clean, which may be carried out before SFM (solderable front metal) deposition. For example, aluminum oxide may be removed from the surface of the chip pads (e.g. from the electrically conductive material 206, 207) during the cleaning.

Due to the cleaning and/or removal of aluminum oxide, better electrical and mechanical contact with subsequent layers, such as the subsequent overlying barrier layer and copper layer SFM (e.g. TiWCu) may be achieved. A redeposition of metal on the passivation may cause leakage current, which may however be avoided by selecting suitable process parameters.

Figure 2B:
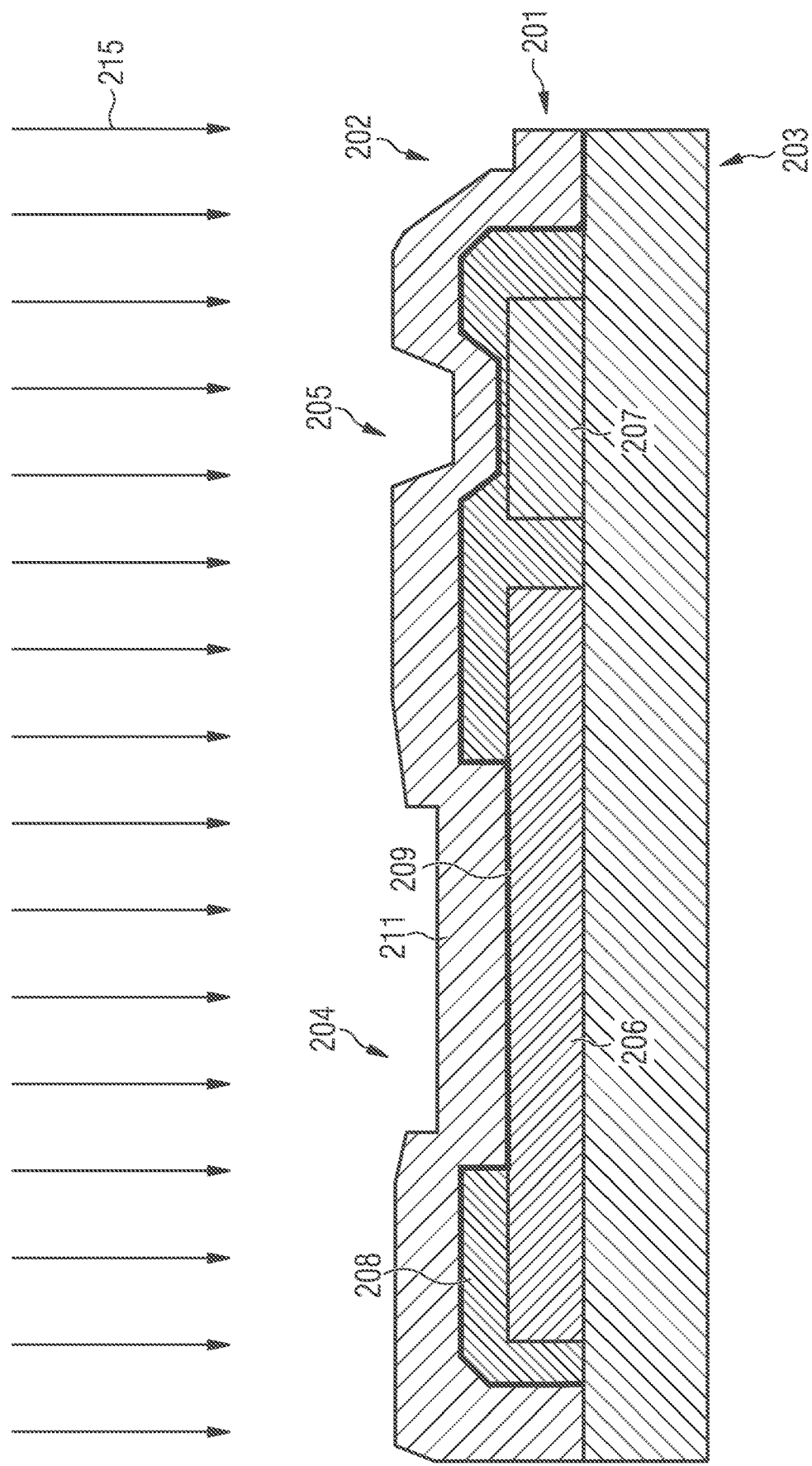

FIG. 2B shows the deposition 215 of a TiW barrier layer 209 over the chip front side 202 (as described connection with FIG. 1). The barrier layer may be deposited such that it covers, e.g., conformally, the chip pads regions 204, 205, the electrically insulating material 208 and one or more sidewalls of the holes of the electrically insulating material 208, for example.

A copper layer 211 may be deposited after depositing the barrier layer 209, e.g. as described in 120 of method 100. The copper layer may cover, e.g. conformally, or may be formed over the barrier layer 209. For example, the copper layer 211 may be formed directly on the TiW barrier layer 209.

The deposition of TiW and/or Cu may be carried out via a deposition process, such as evaporation or sputter deposition, for example.

The copper layer 211 may be used as a solder partner, which may be ideal for lead and lead-free solder connections. The (TiW) barrier layer 209 may be used as a mechanical adhesion promoter between an aluminum based chip metallization, such as electrically conductive material 206, 207 of the chip pad regions 204, 205 and the solder partner (Cu).

Due to the selection of materials, e.g., TiW and Cu, and a corresponding deposition method for depositing the selected materials, a lift-off structuring may be avoided, which avoids the presence of unwanted lift-off residues, and inadequate cleaning of the chip pads. Furthermore, the intermetallic phases to achieve good adhesion between TiW and the neighboring metal layers, e.g., Al below and Cu above may be relatively thin. Consequently, thick and generally brittle intermetallic phases may be avoided from the outset.

Figure 2C:
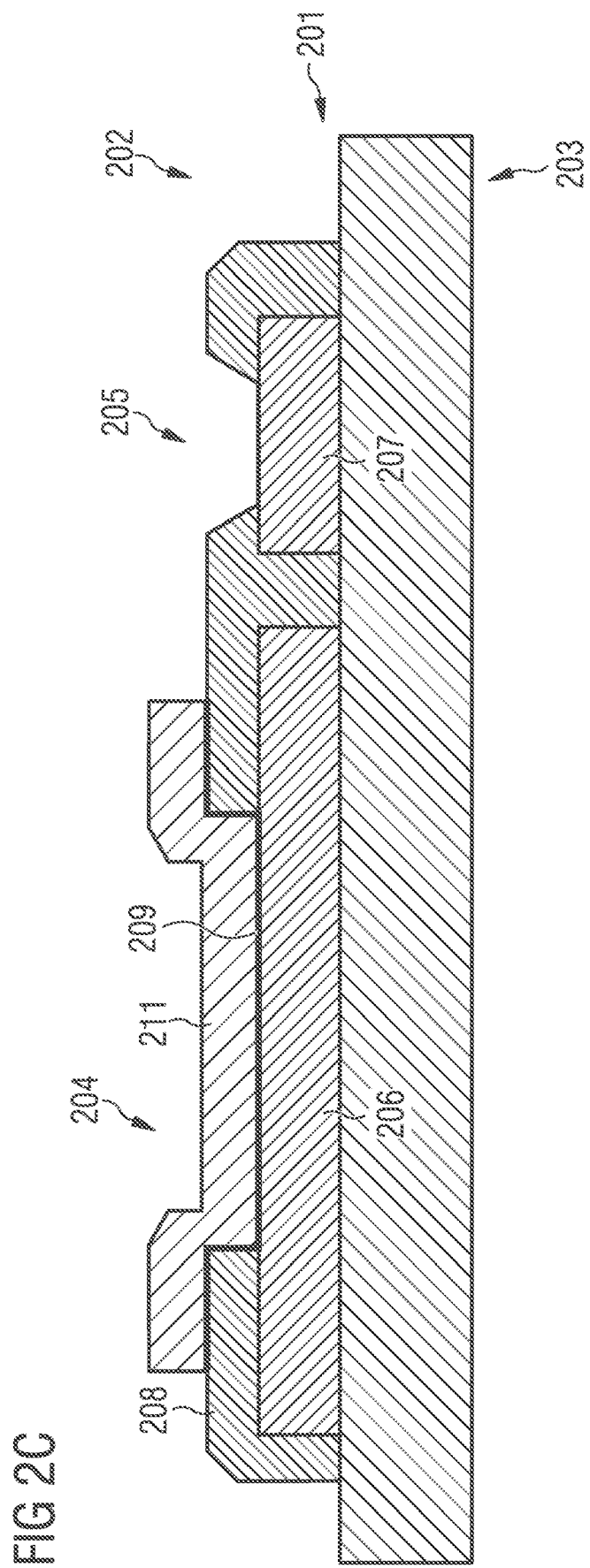

FIG. 2C shows part of the copper layer 211 located outside at least a first chip pad region 204 being removed (e.g. as described in connection with FIG. 1) and part of the TiW barrier layer 209 located outside at least the first chip pad region 204 being removed (e.g., as described in connection with FIG. 1) . For example, FIG. 2C shows SFM structuring being carried out.

Cu etching of the copper layer 211 by the first etching agent may be carried out without damaging aluminum and/or silicon areas due to protection by the TiW barrier layer. For example, the electrically conductive material 206, 207 of the chip pad regions 204, 205 may be protected. The first etching agent may include phosphoric acid or sulfuric acid, for example.

Subsequently, TiW etching of the barrier layer 209 by a second etching agent may cause no damage to Al, silicon, imides or oxides. The second etching agent may be hydrogen peroxide ($H_2O_2$), for example. TiW may be chosen as the barrier layer 209 as other materials, such as pure Ti cannot be structured by a soft $H_2O_2$ etch, for example.

Removing part of the copper layer 211 and the barrier layer 209 located outside the first chip region 204 results in the copper layer 211 and the barrier layer 209 being removed from the second chip pad region 205. However, a remaining portion of the copper layer 211 and the barrier layer 209 remains inside the first chip pad region 204. Therefore, the copper layer 211 and the barrier layer 209 being removed exposes a second chip pad region 205 (e.g., exposes the electrically conductive material 207 of the second chip pad region 205). The remaining portion of the copper layer 211 and the barrier layer 209 still covers the first electrically conductive material 206 of the first chip pad region 204. The remaining portion of the copper layer 211 forms a surface layer of the first chip pad region 204, e.g., a surface layer of the first chip pad.

As the aluminum second chip pad region 205 is exposed by the removal of copper layer 211 and the barrier layer 209 in a location outside the first chip region, the second chip pad region's surface layer is the electrically conductive material 207 which includes predominantly aluminum.

For low flux solder systems, the copper layer 211 may optionally be covered with an oxidization protection layer, e.g., an Ag or Au oxidization protection layer after the deposition of copper layer 211 over barrier layer 209. The deposition of the oxidization protection layer may be carried out directly after the deposition of the copper layer 211 or in a subsequent process after the deposition of the copper layer 211. For example, after removing part of the copper layer 211 and the barrier layer 209 located outside the first chip region 204, the remaining portion of the copper layer 211 still covering the first electrically conductive material 206 of the first chip pad region 204 may be optionally covered with the oxidization protection layer by depositing the oxidization protection layer over the remaining portion of the copper layer 211.

Due to the selection of TiW as a barrier layer and mechanical adhesion promoter between Al-based chip metallization and the solder partner Cu, the Al pads may be protected from the Cu etch. Due to the selection of its corresponding etchants, the chemical structuring of Cu, which may attack Al surfaces may be avoided, e.g. through the implementation of the TiW barrier layer. Further a TiW structuring with $H_2O_2$ may be possible whereby passivation materials and metallization materials, e.g., AlCu and/or Al on substrates (e.g., in process control monitoring or on the chip itself) are not attacked. Variation of the compound composition, although targeted at Ti20% W80%, may be possible within the etch chemistry process window.

As shown in FIG. 2D, the method may further include applying oxygen plasma represented by the arrows 216 to the chip front side. The oxygen plasma may be applied at least to the surface layer of the second chip pad region, for example. The oxygen plasma may be used for creating an aluminum oxide passivation layer on the surface layer of the exposed second chip pad region 205. Copper oxide may also be produced on the surface layer of the exposed first chip pad region 204 during the oxygen ($O_2$) flash process, for example.

Due to the application of the oxygen ($O_2$) plasma process after the TiWCu structuring to perform a surface passivation at the chip front side 202, well-defined quality aluminum oxide layers on open laying aluminum pads may be created. This may guarantee a stable surface for wire bonding and may also protect against corrosion during subsequent processes, e.g. corrosion from deionized water (DI water) during chip individualization, (e.g., dicing), or from soft solder during chip soldering, or from DI water after soft solder cleaning, or during reflow processes in combination with flux. Furthermore, it cleans the passivation (polyimide) from metal residues, thereby avoiding leakage currents and providing a well-defined imide surface for good adhesion to a mold compound, although drying of the imide layer may occur.

In some embodiments, the in situ metal surface clean described in FIG. 2A and/or the surface passivation process described in FIG. 2D may be skipped.

The method may further include joining a bond wire to the surface layer of the second chip pad region 205. For example, the bond wire may be joined to the aluminum surface layer 207 of the second chip pad region 205. For example, the bond wire may include at least one material from the following group of materials, the group of materials comprising aluminum, copper, gold or silver. The bond wire may be joined to the second chip pad region 205 by ball bonding, wedge bonding or nail-head bonding, for example.

Subsequently, soldering material may be deposited over a surface layer, (e.g., over the copper layer 211), of the first chip pad region 204. Therefore, the soldering material may be in contact with the surface layer of the first chip pad region 204. The soldering material may include, for example Tin (Sn). The method may further include melting the soldering material and at least part of the copper layer within the first chip pad region 204, for example, in a solder reflow process, to solder the first chip pad region 204 to an external structure.

The front side edge termination region may be used as a pad protector, which may protect the underlying metal layers from solder or soft solder, without further complexities. The front side edge termination region may be created by using a mask design which overlaps the TiWCu on the passivation. The mask design may be implemented, for example during the copper layer removal and TiW barrier layer removal process (e.g., described in connection with FIG. 1 and FIG. 2B), for example. The mask design may be arranged so that remaining portion of the TiW barrier layer and the copper layer may cover the first chip pad and also part of the electrically insulating polyimide surrounding the first chip pad, for example. This means that the TiW barrier layer and the copper layer may be larger than the first chip pad, for example. For example, the TiW barrier layer and the copper layer may cover (e.g., fully cover) the electrically conductive material 206, and/or one or more sidewalls of the electrically insulating material 208, and/or a surface region of the electrically insulating material 208 parallel to the chip front side.

Any copper oxide produced during the oxygen flash process may be dissolved in the soft solder. Due to the selection of copper and the subsequent production of copper oxide, the copper oxide may be easily removed, and problems such as those encountered in nickel based systems may be avoided. For example, nickel oxide is too difficult or impossible to be dissolved in common soft solder, and is therefore coated with an expensive oxide protection layer in gold (Au) or silver (Ag).

The greater the tin content in the solder, the longer and hotter the solder profile may be, and the longer the expected life time of the solder connection, therefore, thicker Cu may be deposited, in order to satisfy the requirements in a simple way, for example. The TiW and Cu layer thicknesses may be adopted according to the requirements.

Due to the implementation of joining a bond wire to the second chip pad region and /or soldering material to the first chip pad region, a device which includes a chip pad for soldering and a chip pad for wire bonding may be achieved. Furthermore, options for manufacturers are created, where end-users may select between wire-bond pads or solderable pad. In areas where a solder is not required, such as an Al surface of the second chip pad region 205 for wire bonding, a design scheme of structuring masks can be implemented to manufacture pads which are free of TiWCu. The structuring of Cu and TiW uses cheap wet chemicals and is easy to master.

Although the forming of only a first chip pad region and a second chip pad region is shown and described with respect to the figures, it may be understood that the method, described with respect to FIG. 1 and FIGS. 2A to 2D, may also be applied to a chip having more than one first chip pad regions and optionally one or more second chip pad regions, or to more than one chip. For example, the method may be applied to create a plurality of chip pad regions of a first type, (e.g. first chip pad regions), with copper surface layers and a plurality of chip pad regions of a second type, (e.g. second chip pad regions), with aluminum surface layers on the same chip. Such a method may also be carried out by the batch processing of a wafer or substrate, which may include a plurality of semiconductor chips, e.g. tens, or hundreds or thousands of semiconductor chips.

Although tin based solders (lead and lead free) may create a Ni—Sn intermetallic phase, which provides for a good electrical and mechanical contact between Ni and solder, Ni requires an oxidations protection. For example, in an Al(Si) Cu—Ti—NiV—Ag metal layer system structured using lift off technology, the use of Ag as an oxidation protection of Ni fulfills this role only limitedly. For example, for an Ag thickness of 1000 nm, significant oxygen diffusion may take place at temperatures greater than 100° C., which may lead to Ni oxidation and to solder problems. Careful process control may be required to avoid solder problems. The TiWCu stack may avoid this process limitation, for example. The native copper oxide may act as passivation which can be removed by standard flux systems. One or more embodiments described herein may avoid these problems.

Another metal layer system, e.g. NiP—Au or NiP—Ag deposition may normally be carried out using a galvanic process, wherein front side pads may be specified by the passivation openings or pre-plating. Due to the absence of lift-off photoresist, a better cleaning of the Al surface before NiP—Au (or Ag) deposition, in order to achieve better mechanical adhesion and electrical contact. It may also be compatible with lead-free solders, as the thick nickel layer may be incompletely consumed by the lead-free solder and may also be relatively inexpensive to manufacture. However, a front side edge termination, (e.g. a protection of the underlying layers pad edge region areas against the solder/ soft solder), may be technically too difficult to accomplish. One or more embodiments described herein may avoid these problems.

For an AlCu—Cu metal layer system structured via wet chemical etching, the Cu etch chemicals may be incompatible with Al surfaces, e.g. in sawing frame or on copper free chip pads. Further, copper migration problems may occur in Sulfur or phosphorus mold material with copper pads at a positive potential. The embodiments described herein avoid these problems.

More details and aspects are mentioned in connection with the embodiments described above or below (e.g. the semiconductor chip, the first chip pad, the second chip pad, the barrier layer, the copper layer, the soldering material and the bond wire). The embodiments shown in FIGS. 2A to 2D may comprise one or more optional additional features corresponding to one or more aspects mentioned in connection with the proposed concept or one or more embodiments described above (e.g. FIG. 1) or below (e.g. FIG. 3).

Figure 3:
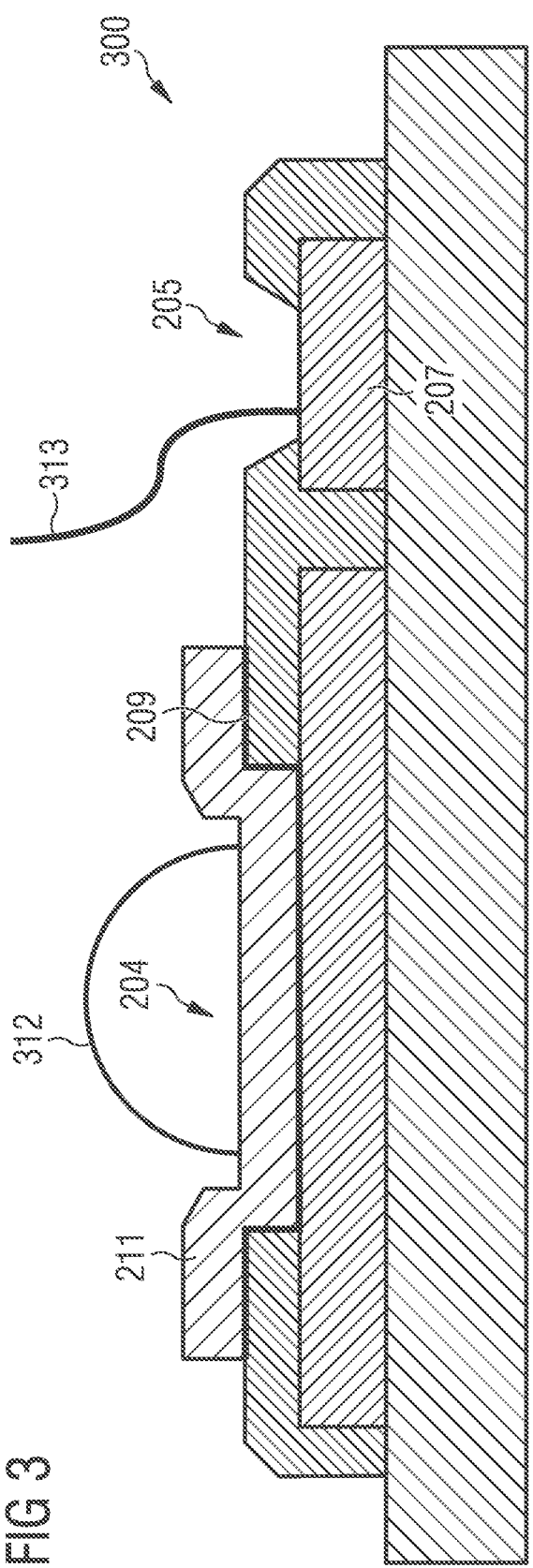
FIG. 3 shows a schematic illustration of a semiconductor chip according to various embodiments.

FIG. 3 shows a schematic illustration of a semiconductor chip 300 according to an embodiment.

The semiconductor chip 300 includes a first chip pad 204 and a second chip pad 205.

The first chip pad 204 includes a surface layer 211 predominantly including copper and the second chip pad 205 includes a surface layer 207 predominantly including aluminum.

Due to the implementation of the chip pads, (e.g., metal pads of Cu or Al), on the chip front side, chip packages with versatile chip connection possibilities may be produced.

Optionally, the first chip pad 204 may further include a titanium tungsten barrier layer, e.g. titanium tungsten barrier layer 209 described according to FIG. 1 and FIGS. 2A to 2D, under the surface layer 211 of the first chip pad 204.

For example, the first chip pad 204 and the second chip pad 205 may be formed on a chip front side.

For example, the semiconductor chip 300 may further include soldering material 312 deposited on the surface layer of the first chip pad 204. The semiconductor chip 300 may further include a bond wire 313 joined to the surface layer of the second chip pad 205. The semiconductor chip 300, soldering material 312 and the bond wire 313 may include one or more or all of the features of the semiconductor chip, the soldering material and the bond wire already described in the embodiments of FIG. 1 and FIGS. 2A to 2D.

Due to the implementation of the chip pads, (e.g., metal pads of Cu or Al), on the chip front side, various chip packages and their interconnects, e.g. Cu pad for a solder connection, or e.g., Al pad for an Al wedge, Cu or Au nailhead wire bond connection, may be designed optimally or according to customer wishes (chip direct delivery). Cu migration prone pads on the chip may also be manufactured by demand to be copper free.

More details and aspects are mentioned in connection with embodiments described above (e.g. the semiconductor chip, the first chip pad, the second chip pad, the barrier layer, the copper layer, the soldering material and the bond wire). The embodiments described in FIG. 3 may comprise one or more optional additional features corresponding to one or more aspects mentioned in connection with the proposed concept or one or more embodiments described above (e.g., FIG. 1 or 2A to 2D).

Various embodiments relate to a TiWCu solderable front metal (SFM) and/or an optimized copper-based solderable chip front side.

Various embodiments provide an evidently easier, more versatile, cheaper and a qualitatively superior grade solution in comparison to common solder front side metallization.

Various embodiments relate to a metal layer system AlCu—TiW—Cu in combination with an appropriate manufacturing process for a chip front side which is robust, can be soldered inexpensively, whose application in various applications is versatile, and is suitable for lead and lead-free solders. Various embodiments provide a good or an optimal electrical mechanical adhesive in combination with an organic based passivation (imide as an adhesion promoter to package mold compound), which do not destroy or compromise aluminum surfaces, for example.

Various embodiments follow the principle that the fewer solder partners there are, the easier it may be to handle or control the metal system. In this case, the only solder partners may be Cu and Sn. The easier the process, the lower the manufacturing cost and easier the system may be in high volumes to produce stably.

Various embodiments are based on the proposed concept, and solve the technical requirement much better than other solutions and maintain a technological improvement in copper metallization.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flowcharts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons.

Furthermore, in some embodiments a single act may include or may be broken into multiple sub acts. Such sub acts may be included and part of the disclosure of this single act unless explicitly excluded.

What is claimed is:

1. A semiconductor chip comprising:
a chip front side;
an aluminum layer comprising predominately aluminum directly located on the chip front side, wherein the aluminum layer has a first region and a second region, and wherein the second region is laterally spaced apart from the first region;
an electrically insulating material located between the first and second regions of the aluminum layer;
a tungsten barrier layer comprising predominantly tungsten directly located on the first region of the aluminum layer but not on the second region of the aluminum layer; and
a copper layer comprising predominantly copper directly located on the tungsten barrier layer so that the first region of the aluminum layer, the tungsten barrier layer and the copper layer form a first chip pad with the copper layer as a surface layer of the first chip pad and the second region of the aluminum layer forms a second chip pad with the aluminum layer as a surface layer of the second chip pad.

2. The semiconductor chip of claim 1, wherein the tungsten barrier layer has a tungsten content ranging from 60% to 90%.

3. The semiconductor chip of claim 1, wherein the tungsten barrier layer is a titanium tungsten barrier layer consisting essentially of titanium and tungsten.

4. The semiconductor chip of claim 3, wherein the titanium tungsten barrier layer has a composition of $Ti0.2W0.8$.

5. The semiconductor chip of claim 1, wherein the surface layer of the second chip pad consists essentially of aluminum.

6. The semiconductor chip of claim 1, wherein the surface layer of the first chip pad consists essentially of copper.

7. The semiconductor chip of claim 1, further comprising a soldering material in contact with the surface layer of the first chip pad.

8. The semiconductor chip of claim 7, further comprising a bond wire joined to the surface layer of the second chip pad.

* * * * *